United States Patent
Lin et al.

(10) Patent No.: US 9,805,796 B2
(45) Date of Patent: Oct. 31, 2017

(54) NON-VOLATILE MEMORY DEVICE AND OPERATING METHOD THEREOF

(71) Applicant: Copee Technology Company, Hsinchu (TW)

(72) Inventors: Chrong-Jung Lin, Hsinchu (TW); Ya-Chin King, Taipei (TW)

(73) Assignee: Copee Technology Company, Hsinchu (TW)

( * ) Notice: Subject to any disclaimer, the term of this patent is extended or adjusted under 35 U.S.C. 154(b) by 0 days.

(21) Appl. No.: 15/436,881

(22) Filed: Feb. 20, 2017

(65) Prior Publication Data

US 2017/0278570 A1    Sep. 28, 2017

(30) Foreign Application Priority Data

Mar. 28, 2016  (TW) .............................. 105109702 A

(51) Int. Cl.
  *G11C 11/34*    (2006.01)
  *G11C 16/04*    (2006.01)
  *G11C 16/14*    (2006.01)

(52) U.S. Cl.
  CPC .......... *G11C 16/0408* (2013.01); *G11C 16/14* (2013.01)

(58) Field of Classification Search
  CPC ...... G11C 16/0408; G11C 16/14; G11C 16/26
  See application file for complete search history.

(56) References Cited

U.S. PATENT DOCUMENTS

| 7,859,906 | B1 | 12/2010 | Vispute | |
|---|---|---|---|---|
| 2006/0083070 | A1* | 4/2006 | Arakawa | G11C 16/28 365/185.21 |
| 2015/0332739 | A1* | 11/2015 | Conte | G11C 7/062 365/189.07 |
| 2015/0348640 | A1* | 12/2015 | La Rosa | G11C 16/26 365/185.29 |
| 2016/0064089 | A1* | 3/2016 | La Rosa | G11C 16/0441 365/185.12 |

FOREIGN PATENT DOCUMENTS

| EP | 2299450 A1 | 3/2011 |
|---|---|---|
| TW | 201027539 A | 7/2010 |
| TW | 201447907 A | 12/2014 |
| WO | 2009012209 A1 | 1/2009 |

* cited by examiner

*Primary Examiner* — Toan Le
(74) *Attorney, Agent, or Firm* — CKC & Partners Co., Ltd.

(57) ABSTRACT

A non-volatile memory device includes a first floating gate unit, a second floating gate unit, a selecting gate unit and a comparator. The first floating gate unit is configured to generate a first current according to a first bit signal and a control electric potential. The second floating gate unit is connected with the first floating gate unit in parallel, and configured to generate a second current according to a second bit signal and the control electric potential. The selecting gate unit is connected to the first floating gate unit and the second floating gate unit, and configured to generate the control electric potential according to a source signal and a word signal. The comparator is electrically connected to the first floating gate unit and the second floating gate unit, and configured to compare the first current with the second current, so as to generate a data-stored state signal.

10 Claims, 3 Drawing Sheets

NON-VOLATILE MEMORY DEVICE AND OPERATING METHOD THEREOF

RELATED APPLICATIONS

This application claims priority to Taiwan Application Serial Number 105109702, filed Mar. 28, 2016, which is herein incorporated by reference.

BACKGROUND

Field of Invention

The present disclosure relates to a memory system. More particularly, the present disclosure relates to a non-volatile memory device adopting a differential structure and an operating method thereof.

Description of Related Art

With the rapid advance of digital technology and the release of various kinds of electronics, performance requirements of memory units (such as high density and high speed storage) become more and more stringent. The memory unit is commonly integrated with an integrated chip system into a single chip by single chip technology to decrease size of chip systems according to the current trend of manufacturing the integrated chip system. Accordingly, the memory unit is correspondingly adopted a single poly-silicon gate to achieve the requirement of decreasing the size of chip systems. However, with the size decrement of chip systems, thickness of a gate oxide layer of the memory unit is correspondingly decreases. When the thickness of the gate oxide layer is excessively small, the current leakage may be incurred in the memory unit.

Traditionally, for obtaining a storage state of the memory unit, a comparator is used for comparing an electric potential of the memory unit with a reference electric potential, so as to determine a storage state of the memory unit. However, when the size decrement of chip systems results in increment of the current leakage, the determination of the storage state of the memory unit made by the above-mentioned comparing manner may be incorrect. Furthermore, additional peripheral circuits are commonly necessary to generate an accurate reference electric potential, but this also dramatically increases area of chip systems and cost of manufacturing chip systems.

Accordingly, a significant challenge is related to ways in which to accurately determine storage states of memory units while at the same time decreasing cost of manufacturing the memory units associated with designing the memory units.

SUMMARY

An aspect of the present disclosure is directed to a non-volatile memory device. The non-volatile memory device includes a first floating gate unit, a second floating gate unit, a selecting gate unit and a comparator. The first floating gate unit is configured to generate a first current according to a first bit signal and a control electric potential. The second floating gate unit is connected with the first floating gate unit in parallel, and configured to generate a second current according to a second bit signal and the control electric potential. The selecting gate unit is connected to the first floating gate unit and the second floating gate unit, and configured to generate the control electric potential according to a source signal and a word signal. The comparator is electrically connected to the first floating gate unit and the second floating gate unit, and configured to compare the first current with the second current to generate a data-stored state signal.

Another aspect of the present disclosure is directed to an operating method applied to a non-volatile memory device. The non-volatile memory device includes a first floating gate unit, a second floating gate unit, a selecting gate unit and a comparator. The operating method includes operations as follows: generating a control electric potential via the selecting gate unit according a source signal and a word signal; generating a first current and a second current via the first floating gate unit and the second floating gate unit respectively according to the control electric potential, a first bit signal and a second bit signal; and comparing the first current with the second current via the comparator to generate a data-stored state signal.

It is to be understood that the foregoing general description and the following detailed description are by examples, and are intended to provide further explanation of the invention as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
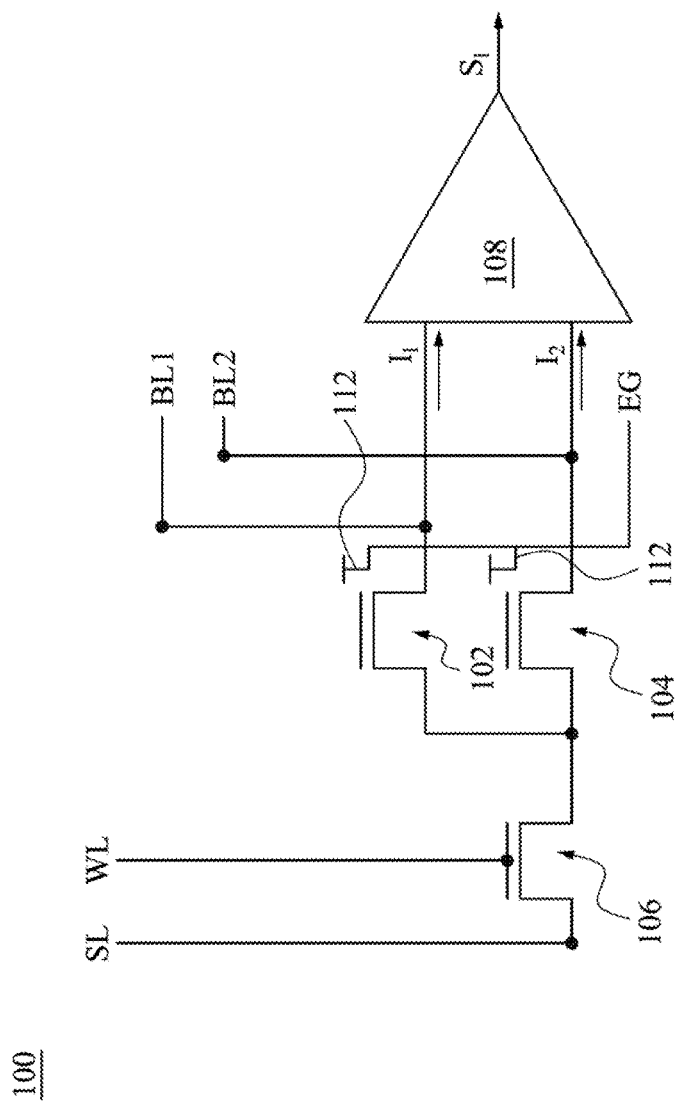
FIG. 1 is a circuit schematic diagram of a non-volatile memory device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a circuit schematic diagram of a non-volatile memory device 100 according to embodiments of the present disclosure. As shown in FIG. 1, the non-volatile memory device 100 includes a first floating gate unit 102, a second floating gate unit 104, a selecting gate unit 106 and a comparator 108. The selecting gate unit 106 is connected to one terminal of the first floating gate unit 102 and one terminal of the second floating gate unit 104, and the first floating gate unit 102 is connected with the second floating gate unit 104 in parallel. The comparator 108 is electrically connected to the other terminal of the first floating gate unit 102 and the other terminal of the second floating gate unit 104.

The selecting gate unit 106 is configured to receive voltage values of a source signal SL and a word signal WL, and generate a control electric potential according to voltage values of the source signal SL and the word signal WL. The first floating gate unit 102 is configured to receive a first bit signal BL1 and the control electric potential generated from the selecting gate unit 106, and to generate a first current I1 according to a voltage value of the first bit signal BL1 and a voltage value of the control electric potential. The second floating gate unit 104 is configured to receive a second bit signal BL2 and the control electric potential generated from the selecting gate unit 106, and to generate a second current I2 according to a voltage value of the second bit signal BL2 and the voltage value of the control electric potential. After the first floating gate unit 102 and the second floating gate unit 104 respectively generate the first current I1 and the second current I2, the comparator 108 is configured to compare the first current I1 with second current I2, and to generate a data-stored state signal S1 according to the comparison result.

In this embodiment, at a moment, one of the first floating gate unit 102 and the second floating gate unit 104 can be triggered. In one embodiment, when the first floating gate unit 102 is triggered, it is determined that the data-stored state signal S1 represents that the non-volatile memory device 100 is configured to store a binary bit 1; when the second floating gate unit 104 is triggered, it is determined that the data-stored state signal S1 represents that the non-volatile memory device 100 is configured to store a binary bit 0; when neither of the first floating gate unit 102 and the second floating gate unit 104 is triggered, it is determined that the data-stored state signal S1 represents that the non-volatile memory device 100 is not configured for data storage. It should be noted that, the relation among the data-stored state signal S1, the first floating gate unit 102 and the second floating gate unit 104 mentioned above is for illustration, and the present disclosure is not limited thereto.

In one embodiment, the non-volatile memory device 100 further includes an erasing gate unit 112. The erasing gate unit 112 is connected to the first floating gate unit 102 and the second floating gate unit 104. The erasing gate unit 112 receives an erasing signal EG and erases states of electrical properties of the first floating gate unit 102 and the second floating gate unit 104 according to a voltage value of the erasing signal EG. For example, when the non-volatile memory device 100 executes data storage process, the non-volatile memory device 100 enables the erasing gate unit 112 by the erasing signal EG in advance, so as to erase the states of the electrical properties of the first floating gate unit 102 and the second floating gate unit 104 to ensure that neither of the first floating gate unit 102 and the second floating gate unit 104 is triggered. In another embodiments, the erasing gate unit 112 can be used as a writing gate which is configured to trigger the first floating gate unit 102 and the second floating gate unit 104 to generate the first current I1 and the second current I2.

For example, the non-volatile memory device 100 can operate according to voltage values mentioned in Table 1 as shown below, and "Float" represents floating voltage.

TABLE 1

Voltage values of signals and corresponding operation modes of the non-volatile memory device

| Operation Modes of the non-volatile memory device | Signal | | | | |
|---|---|---|---|---|---|
| | Word Signal WL | Source Signal SL | First Bit Signal BL1 | Second Bit Signal BL2 | Erasing Signal EG |
| Trigger First Floating Gate | 3.3 V | 0 V | 7 V | 0 V | Float |
| Second Floating Gate | 3.3 V | 0 V | 0 V | 7 V | Float |
| Erase | 0 V | 0 V | 0 V | 0 V | 9.5 V |

As mentioned in Table 1, when the non-volatile memory device 100 is not selected for data storage, a voltage value of the word signal WL is 0V; when the non-volatile memory device 100 is selected for data storage, the word signal WL, the source signal SL, the first bit signal BL1, the second bit signal BL2 and the erasing signal EG respectively have corresponding voltage values according to the operation mode of the non-volatile memory device 100. For example, when the first floating gate unit 102 is selected to be triggered by the non-volatile memory device 100, the voltage value of the word signal WL is 3.3V, the voltage value of the source signal SL is 0V, the voltage value of the first bit signal BL1 is 7V, the voltage value of the second bit signal BL2 is 0V, and the voltage value of the erasing signal EG is the floating voltage. When the states of the electrical properties of the first floating gate unit 102 and the second floating gate unit 104 are selected to be erased by the non-volatile memory device 100, the voltage values of the word signal WL, the source signal SL, the first bit signal BL1, the second bit signal BL2 are 0V, and the voltage value of the erasing signal EG is 9.5V. When the second floating gate unit 104 is selected to be triggered by the non-volatile memory device 100, the analysis of the voltage values of the signals corresponding to the non-volatile memory device 100 are similar to the illustration mentioned above, so a detail description will not be repeated herein.

In one embodiment, the comparator 108 determines the states of the electrical properties of the first floating gate unit 102 and the second floating gate unit 104 according to a current difference between the first current I1 and the second current I2. For example, when the first current I1 is smaller than the second current I2, it is determined that the first floating gate unit 102 is triggered; when the first current I1 is larger than the second current I2, it is determined that the second floating gate unit 104 is triggered; when the first current I1 is equal to the second current I2, it is determined that neither of the first floating gate unit 102 and the second floating gate unit 104 is triggered. It should be noted that, the determination of triggering the first floating gate unit 102 and the second floating gate unit 104 mentioned above is for illustration, and the present disclosure is not limited thereto.

Figure 2:
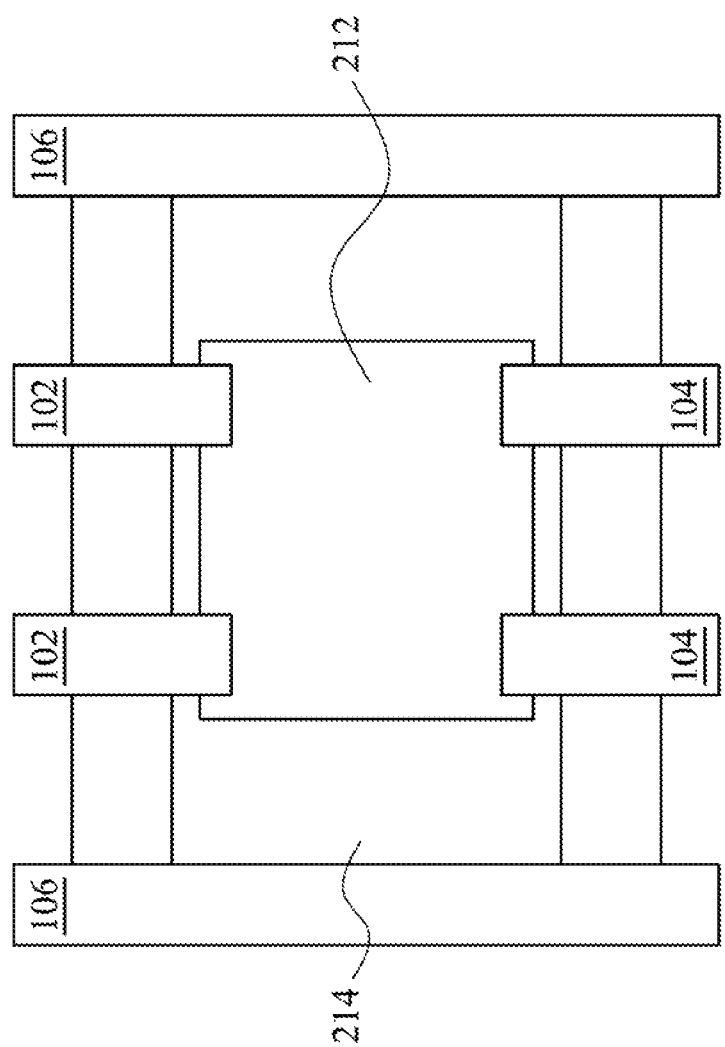
FIG. 2 is a schematic diagram of the non-volatile memory device according to embodiments of the present disclosure.

FIG. 2 is a schematic diagram of the non-volatile memory device 100 according to embodiments of the present disclosure. As shown in FIG. 2, edges of the first floating gate unit 102 and the second floating gate unit 104 overlay the erasing gate unit 212 during layout. In one embodiment, when portions of the edges of the first floating gate unit 102 and the second floating gate unit 104 which overlay the erasing gate unit 212 are decreased, voltage differences among the first floating gate unit 102, the second floating gate unit 104 and the erasing gate unit 212 can be increased, so that the erasing gate unit 212 can erase the states of the electrical properties of the first floating gate unit 102 and the second floating gate unit more efficiently.

In another embodiment, size of the first floating gate unit 102 and the second floating gate unit 104 are decreased for increasing channel resistance corresponding to the first floating gate unit 102 and the second floating gate unit 104, and size of the selecting gate unit 106 is increased for decreasing channel resistance corresponding to the selecting gate unit 106. Accordingly, operation efficiency of the non-volatile memory device 100 can be effectively enhanced. In further embodiment, an isolation section 214 is disposed between the different non-volatile memory devices 100. The isolation section 214 is configured to isolate current effect between the different non-volatile memory devices 100, so as to remain operation of the non-volatile memory devices 100.

Figure 3:
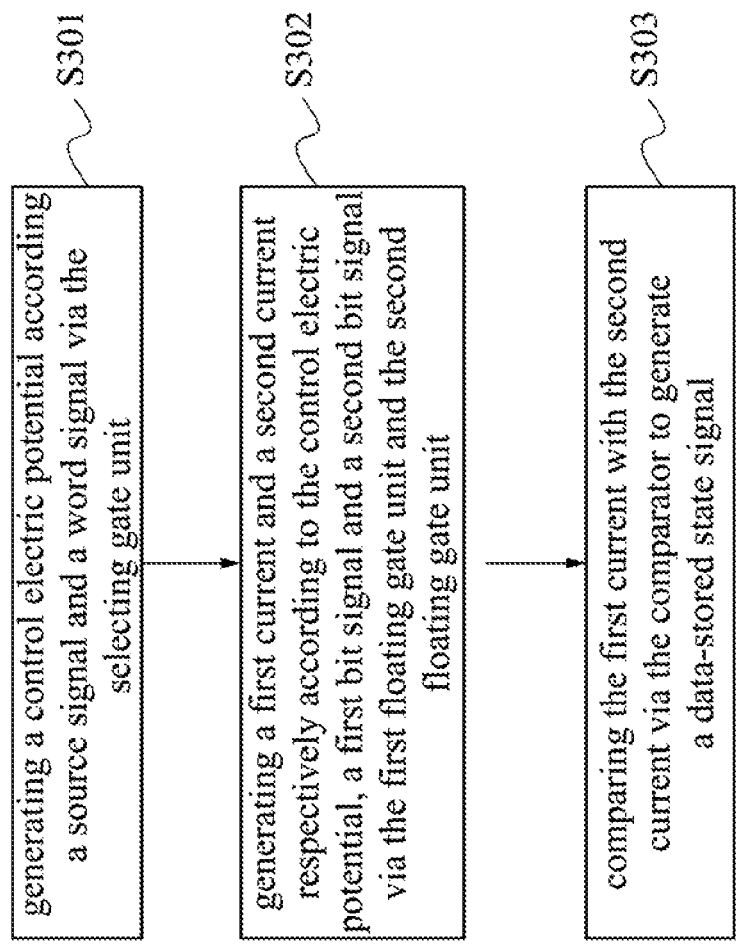
FIG. 3 is a flow chart of an operating method applied to a non-volatile memory device according to embodiments of the present disclosure.

FIG. 3 is a flow chart 300 of an operating method applied to a non-volatile memory device according to embodiments of the present disclosure. In one embodiment, this operating method can be executed by the non-volatile memory device 100 mentioned above, but the present disclosure is not limited thereto. For facilitating the understanding of the flow chart 300, the non-volatile memory device 100 is used as an example for illustrating the flow chart 300. As shown in FIG. 3, in an operation S301, firstly, it is receiving the source signal SL and the word signal WL and generating the control electric potential according to the voltage values of the source signal SL and the word signal WL via the selecting gate unit 106. In an operation S302, it is receiving control electric potential, the first bit signal BL1 and the second bit signal BL2 and generating the first current I1 and the second current I2 according to the voltage values of the control electric potential, the first bit signal BL1 and the second bit signal respectively via the first floating gate unit 102 and the second floating gate unit 104. Finally, in an operation S303, after the first floating gate unit 102 and the second floating gate unit 104 generates the first current I1 and the second current I2, it is comparing the first current I1 with second current I2 via the comparator 108 to generate the data-stored state signal S1.

In one embodiment, before executing the operation S301, it is enabling the erasing gate unit 112 by the erasing signal EG, so as to erase the states of the electrical properties of the first floating gate unit 102 and the second floating gate unit 104 to ensure that neither of the first floating gate unit 102 and the second floating gate unit 104 is triggered.

In one embodiment, in the operation S303, the states of the electrical properties of the first floating gate unit 102 and the second floating gate unit 104 is determined according to the current difference between the first current I1 and the second current I2, so as to generate the data-stored state signal S1. For example, when the first current I1 is smaller than the second current I2, it is determined that the first floating gate unit 102 is triggered; when the first current I1 is larger than the second current I2, it is determined that second floating gate unit 104 is triggered; when the first current I1 is equal to the second current I2, it is determined that neither of the first floating gate unit 102 and the second floating gate unit 104 is triggered. It should be noted that, the determination of triggering the first floating gate unit 102 and the second floating gate unit 104 mentioned above is for illustration, and the present disclosure is not limited thereto.

As mentioned above, the present disclosure implements the non-volatile memory device by a differential structure. Accordingly, the non-volatile memory device can execute a comparison procedure merely according to currents generated itself, so as to determine data-stored states. Therefore, traditionally, a peripheral circuit which is configured to generate a reference electric potential for the non-volatile memory device to determine the data-stored states can be removed, so as to dramatically decrease an area of the non-volatile memory device and cost of manufacturing the non-volatile memory device. Additionally, when a coupling portion of the edge of the floating gate unit which overlays the erasing gate unit is decreased, the voltage difference between the floating gate unit and the erasing gate unit can be increased, so as to enhance erasing effect of the erasing gate unit.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present invention cover modifications and variations of this present disclosure provided they fall within the scope of the following claims.

What is claimed is:

1. A non-volatile memory device, comprising:
   a first floating gate unit, configured to generate a first current according to a first bit signal and a control electric potential;
   a second floating gate unit, being connected with the first floating gate unit in parallel, and configured to generate a second current according to a second bit signal and the control electric potential;
   a selecting gate unit, connected to the first floating gate unit and the second floating gate unit, and configured to generate the control electric potential according to a source signal and a word signal; and
   a comparator, electrically connected to the first floating gate unit and the second floating gate unit, and configured to compare the first current with the second current to generate a data-stored state signal.

2. The non-volatile memory device of claim 1, wherein the non-volatile memory device further comprises:
   an erasing gate unit, connected to the first floating gate unit and the second floating gate unit, and configured to erase states of electrical properties of the first floating gate unit and the second floating gate unit according to an erasing signal.

3. The non-volatile memory device of claim 1, wherein the comparator determines states of electrical properties respectively corresponding to the first floating gate unit and the second floating gate unit according to a current difference between the first current and the second current, so as to generate the data-stored state signal.

4. The non-volatile memory device of claim 3, wherein when the first current is smaller than the second current, it is determined that the first floating gate unit is triggered; when the first current is larger than the second current, it is determined that the second floating gate is triggered; when the first current is equal to the second current, it is determined that neither of the first floating gate unit and the second floating gate unit is triggered.

5. The non-volatile memory device of claim 1, wherein a first terminal of the selecting gate unit is configured to receive the source signal, a second terminal of the selecting gate unit is configured to receive the word signal, a third terminal of the selecting gate unit is electrically connected to one terminal of the first floating gate unit and one terminal of the second floating gate unit, and the third terminal of the selecting gate is configured to transmit the control electric potential.

6. The non-volatile memory device of claim 5, wherein the other terminal of the first floating gate unit is configured to receive the first bit signal and electrically connected to the comparator, and the other terminal of the second floating gate unit is configured to receive the second bit signal and electrically connected to the comparator.

7. An operating method, applied to a non-volatile memory device, wherein the non-volatile memory device comprises a first floating gate unit, a second floating gate unit, a selecting gate unit and a comparator, and the operating method comprises:
 generating a control electric potential according a source signal and a word signal via the selecting gate unit;
 generating a first current and a second current respectively according to the control electric potential, a first bit signal and a second bit signal via the first floating gate unit and the second floating gate unit; and
 comparing the first current with the second current via the comparator to generate a data-stored state signal.

8. The operating method of claim 7, wherein the non-volatile memory device further comprises an erasing gate unit, and the operating method further comprises:
 erasing states of electrical properties of the first floating gate unit and the second floating gate unit according to an erasing signal via the erasing gate unit.

9. The operating method of claim 7, wherein comparing the first current with the second current via the comparator to generate the data-stored state signal comprises:
 determining states of electrical properties respectively corresponding to the first floating gate unit and the second floating gate unit according to a current difference between the first current and the second current, so as to generate the data-stored state signal.

10. The operating method of claim 9, wherein determining the states of the electrical properties respectively corresponding to the first floating gate unit and the second floating gate unit according to the current difference between the first current and the second current comprises:
 when the first current is smaller than the second current, it is determined that the first floating gate unit is triggered; when the first current is larger than the second current, it is determined that the second floating gate unit is triggered; when the first current is equal to the second current, it is determined that neither of the first floating gate unit and the second floating gate unit is triggered.

* * * * *